United States Patent
Miyamoto et al.

(10) Patent No.: US 10,444,296 B2
(45) Date of Patent: Oct. 15, 2019

(54) CONTROL DEVICE, CONTROL METHOD, AND RECORDING MEDIUM

(71) Applicant: NEC Corporation, Tokyo (JP)

(72) Inventors: Junichi Miyamoto, Tokyo (JP); Yuichi Imamura, Tokyo (JP); Shingo Takahashi, Tokyo (JP); Sho Ohtani, Tokyo (JP); Hiroshi Kajitani, Tokyo (JP)

(73) Assignee: NEC Corporation, Tokyo (JP)

( * ) Notice: Subject to any disclaimer, the term of this patent is extended or adjusted under 35 U.S.C. 154(b) by 260 days.

(21) Appl. No.: 15/507,912

(22) PCT Filed: Sep. 7, 2015

(86) PCT No.: PCT/JP2015/004527
§ 371 (c)(1),
(2) Date: Mar. 1, 2017

(87) PCT Pub. No.: WO2016/038873
PCT Pub. Date: Mar. 17, 2016

(65) Prior Publication Data
US 2017/0254857 A1    Sep. 7, 2017

(30) Foreign Application Priority Data
Sep. 12, 2014  (JP) ................. 2014-185979

(51) Int. Cl.
*G01R 31/388* (2019.01)
*G01R 31/3842* (2019.01)
(52) U.S. Cl.
CPC ....... *G01R 31/388* (2019.01); *G01R 31/3842* (2019.01)
(58) Field of Classification Search
None
See application file for complete search history.

(56) References Cited

U.S. PATENT DOCUMENTS

| | | | | |
|---|---|---|---|---|
| 7,557,584 B2 * | 7/2009 | Murakami | ......... | G01R 31/3842 324/429 |
| 2016/0351976 A1 * | 12/2016 | Kawahara | ............. | H01M 10/48 |

FOREIGN PATENT DOCUMENTS

| | | |
|---|---|---|
| JP | 2002-236155 A | 8/2002 |
| JP | 2008-26166 A | 10/2008 |

(Continued)

OTHER PUBLICATIONS

International Search Report corresponding to PCT/JP2015/004527, 1 page, dated Dec. 8, 2015.

(Continued)

*Primary Examiner* — Paresh H Patel
(74) *Attorney, Agent, or Firm* — Wilmer Cutler Pickering Hale and Dorr LLP

(57) ABSTRACT

A control device of the present invention includes: an OCV estimating unit that estimates, based on a voltage value and a current value of a controlled device, an OCV of the controlled device; a capacity calculating unit that calculates an integrated capacity of the controlled device based on the current value of the controlled device; and a control unit that controls discharging and charging of the controlled device, and calculates a full capacity of the controlled device based on: a first SOC and a second SOC at a predetermined first OCV and a predetermined second OCV during the discharging or the charging of the controlled device; a first integrated capacity and a second integrated capacity at the first OCV and the second OCV during the discharging; and a third integrated capacity and a fourth integrated capacity at the second OCV and the first OCV during the charging.

9 Claims, 8 Drawing Sheets

(56) References Cited

FOREIGN PATENT DOCUMENTS

| | | |
|---|---|---|
| JP | 2013-250071 A | 12/2013 |
| WO | WO-2008/026476 A1 | 3/2008 |

OTHER PUBLICATIONS

Written Opinion of International Search Authority corresponding to PCT/JP2015/004527, 5 pages, dated Dec. 8, 2015.

* cited by examiner

CONTROL DEVICE, CONTROL METHOD, AND RECORDING MEDIUM

CROSS-REFERENCE TO RELATED APPLICATIONS

This application is a national stage application of International Application No. PCT/JP2015/004527 entitled "CONTROL DEVICE, CONTROL METHOD, AND RECORDING MEDIUM, filed on Sep. 7, 2015, which claims the benefit of the priority of Japanese Patent Application No. 2014-185979 filed on Sep. 12, 2014, the disclosures of each of which are hereby incorporated by reference in their entirety.

TECHNICAL FIELD

The present invention relates to a control device that is connected to a device holding electric power, such as a storage battery, and that processes information about capacity of the device, as well as relating to a control method and a recording medium.

BACKGROUND ART

A storage battery for household or industrial use has an issue that the battery, when fully charged, has a reduced capacity due to repeated charges and discharges (charge-discharge). For this reason, techniques for estimating a full capacity of a storage battery are conventionally used (see PTL 1 and PTL 2, for example).

According to the method for computing a remaining capacity of a storage battery described in PTL 1, the storage battery is discharged until the voltage reaches a discharge alarm voltage. Then, according to the method described in PTL 1, the storage battery is charged until fully charged. Then, according to the method described in PTL 1, as a replenishing charge capacity, a charge capacity from a state in which the voltage of the storage battery has dropped to the discharge alarm voltage to fully charged is computed. Then, according to the method described in PTL 1, as a new learned capacity of the storage battery, a value is computed by adding the replenishing charge capacity to a discharge alarm capacity, which is the battery capacity remaining when the battery is discharged up to the discharge alarm voltage.

According to the method described in PTL 1, a new learned capacity of the battery is computed by adding the replenishing charge capacity to the discharge alarm capacity, which is the remaining amount in the storage battery at the end of discharging. Thus, the method described in PTL 1 can calculate the learned capacity even in the degraded storage battery. In addition, according to the method described in PTL 1, the remaining amount in the storage battery is computed by subtracting the discharge capacity from the charge capacity of the storage battery, and then the remaining capacity (SOC (state of charge)) is computed based on the ratio between the computed remaining amount and the learned capacity. Thus, the method described in PTL 1 achieves correct computation of, in particular, the remaining capacity at the end of discharging.

According to the method for detecting a full-charge capacity of a storage battery described in PTL 2, a first no-load voltage ($V_{OCV1}$) of the storage battery as of a first no-load timing when the storage battery is in the no-load state and a second no-load voltage ($V_{OCV}$) of the storage battery as of a second no-load timing are detected. Then, according to the method described in PTL 2, it is determined whether the detected first no-load voltage ($V_{OCV1}$) falls within a predetermined voltage range. According to the method described in PTL 2, when the first no-load voltage ($V_{OCV1}$) falls within the predetermined voltage range, a first remaining capacity ($SOC_1$ [%]) of the storage battery is determined from the detected first no-load voltage ($V_{OCV1}$). Then, according to the method described in PTL 2, a second remaining capacity ($SOC_2$ [%]) of the storage battery is determined from the second no-load voltage ($V_{OCV2}$). Next, according to the method described in PTL 2, the rate of change ($\delta S$ [%]) in remaining capacity (SOC [%]) is computed based on a difference between the first remaining capacity ($SOC_1$ [%]) and the second remaining capacity ($SOC_2$ [%]). In addition, according to the method described in PTL 2, the change in capacity value ($\delta Ah$) of the storage battery is computed based on an integrated value of the charge current and discharge current of the storage battery to be charged-discharged between the first no-load timing and the second no-load timing. Then, according to the method described in PTL 2, the full-charge capacity (Ahf) of the storage battery is computed by applying the rate of change ($\delta S$ [%]) in remaining capacity (SOC [%]) and the change in capacity value ($\delta Ah$) to the equation: "Ahf=$\delta Ah/(\delta S/100)$".

According to the method described in PTL 2, first and second remaining capacities are determined based on first and second no-load voltages as of first and second no-load timings. Then, according to the method described in PTL 2, the change in capacity value of the storage battery is computed based on an integrated value of the charge current and discharge current of the storage battery being charged-discharged between the first and second no-load timings. Then, according to the method described in PTL 2, the full-charge capacity of the storage battery is computed based on the rate of change in remaining capacity and the change in capacity value between the first and second no-load timings. Accordingly, the method described in PTL 2 can compute a full-charge capacity of a storage battery without using full charge after the storage battery is completely discharged.

CITATION LIST

Patent Literature

[PTL 1] Japanese Unexamined Patent Application Publication No. 2002-236155
[PTL 1] Japanese Unexamined Patent Application Publication No. 2008-261669

SUMMARY OF INVENTION

Technical Problem

According to the method described in PTL 1, after the storage battery is discharged until the voltage reaches the discharge alarm voltage, the storage battery is continuously charged until fully charged, and then the full capacity is computed by using the charge capacity for the process. However, during the discharging up to the discharge alarm voltage, the discharge current varies with the load connected to the storage battery. Hence, the method described in PTL 1 has an issue that, when the amount of discharge current is small, it takes a longer discharge time until the voltage reaches the discharge alarm voltage. In addition, according to the method described in PTL 1, after the storage battery is discharged until the voltage reaches the discharge alarm voltage, the storage battery is charged until fully charged. The method described in PTL 1 also involves a longer charge time, and thus has an issue that it takes a longer time for the series of discharge and charge processes for detecting a full capacity.

According to PTL 2, it is necessary to have a no-load state during the charge process to detect no-load voltages at first and second no-load timings. For the purpose of detecting a no-load voltage in the state of exactly no load, the method described in PTL 2 makes it necessary to stop charging in the course of charging and then keep the state of no load for a predetermine time period (for example, about one hour in some cases). The method described in PTL 2 has thus an issue that it takes a longer charge time.

According to the methods described in PTLs 1 and 2, a capacity is calculated based on an integrated value of charge current. However, a measured value usually contains an error (e.g., an offset error). When the measured value of charge current includes a positive offset error, the measured value of charge current is greater than the actual value (true value) of charge current by the value of the offset error. On the other hand, when the measured value of charge current includes a negative offset error, the measured value of charge current is less than the actual value (true value) of charge current by the value of the offset error. Consequently, according to the methods described in PTL 1 and PTL 2, an integrated capacity calculated by integrating measured values of charge current may be larger or smaller than the actual capacity. The methods described in PTL 1 and PTL 2 have thus an issue that a full-charge capacity may not be calculated correctly.

An object of the present invention is to solve the above-described problems, providing a control device, a control method, and a recording medium for calculating a full capacity in a short time and with high precision, even when the measured current used for calculating an integrated capacity contains an offset error.

Solution to Problem

A control device according to one aspect of the present invention includes: an OCV estimating unit that estimates, based on a voltage value and a current value of a controlled device, an open circuit voltage (OCV) of the controlled device; a capacity calculating unit that calculates an integrated capacity of the controlled device based on the current value of the controlled device; and a control unit that controls discharging and charging of the controlled device, and calculates a full capacity of the controlled device based on: a first SOC and a second SOC that are remaining capacities (SOC) at a predetermined first OCV and a predetermined second OCV during the discharging or the charging of the controlled device; a first integrated capacity and a second integrated capacity that are integrated capacities at the first OCV and the second OCV during the discharging; and a third integrated capacity and a fourth integrated capacity that are integrated capacities at the second OCV and the first OCV during the charging.

A control device according to one aspect of the present invention includes: a control device including: an OCV estimating unit that estimates, based on a voltage value and a current value of a controlled device, an open circuit voltage (OCV) of the controlled device, a capacity calculating unit that calculates an integrated capacity of the controlled device based on the current value of the controlled device, and a control unit that controls discharging and charging of the controlled device, and calculating calculates a full capacity of the controlled device based on: a first SOC and a second SOC that are remaining capacities (SOC) at a predetermined first OCV and a predetermined second OCV during the discharging or the charging of the controlled device, a first integrated capacity and a second integrated capacity that are integrated capacities at the first OCV and the second OCV during the discharging, and a third integrated capacity and a fourth integrated capacity that are integrated capacities at the second OCV and the first OCV during the charging; the controlled device; a voltage measuring unit that measuring a voltage value of the controlled device; a current measuring unit that measuring a current value of the controlled device; and a charge-discharge control unit that controls charge and discharge operations of the controlled device based on an instruction from the control unit.

A control method according to one aspect of the present invention includes: estimating, based on a voltage value and a current value of a controlled device, an open circuit voltage (OCV) of the controlled device; calculating an integrated capacity of the controlled device based on the current value of the controlled device; controlling discharging and charging of the controlled device, and calculating a full capacity of the controlled device based on: a first SOC and a second SOC that are remaining capacities (SOC) at a predetermined first OCV and a predetermined second OCV during the discharging or the charging of the controlled device; a first integrated capacity and a second integrated capacity that are integrated capacities at the first OCV and the second OCV during the discharging; and a third integrated capacity and a fourth integrated capacity that are integrated capacities at the second OCV and the first OCV during the charging.

A computer readable non-transitory recording medium embodying a program, the program causing a computer to perform a method, the method comprising: estimating, based on a voltage value and a current value of a controlled device, an open circuit voltage (OCV) of the controlled device; calculating an integrated capacity of the controlled device based on the current value of the controlled device; and controlling discharging and charging of the controlled device, and calculating a full capacity of the controlled device based on: a first SOC and a second SOC, which are remaining capacities (SOC) at a predetermined first OCV and a predetermined second OCV during the discharging or the charging of the controlled device; a first integrated capacity and a second integrated capacity, which are integrated capacities at the first OCV and the second OCV during the discharging; and a third integrated capacity and a fourth integrated capacity, which are integrated capacities at the second OCV and the first OCV during the charging.

Advantageous Effects of Invention

The present invention can provide an effect that a full capacity can be calculated in a short time and with precision, even when the measured current contains an offset error.

DESCRIPTION OF EMBODIMENTS

Figure 1:
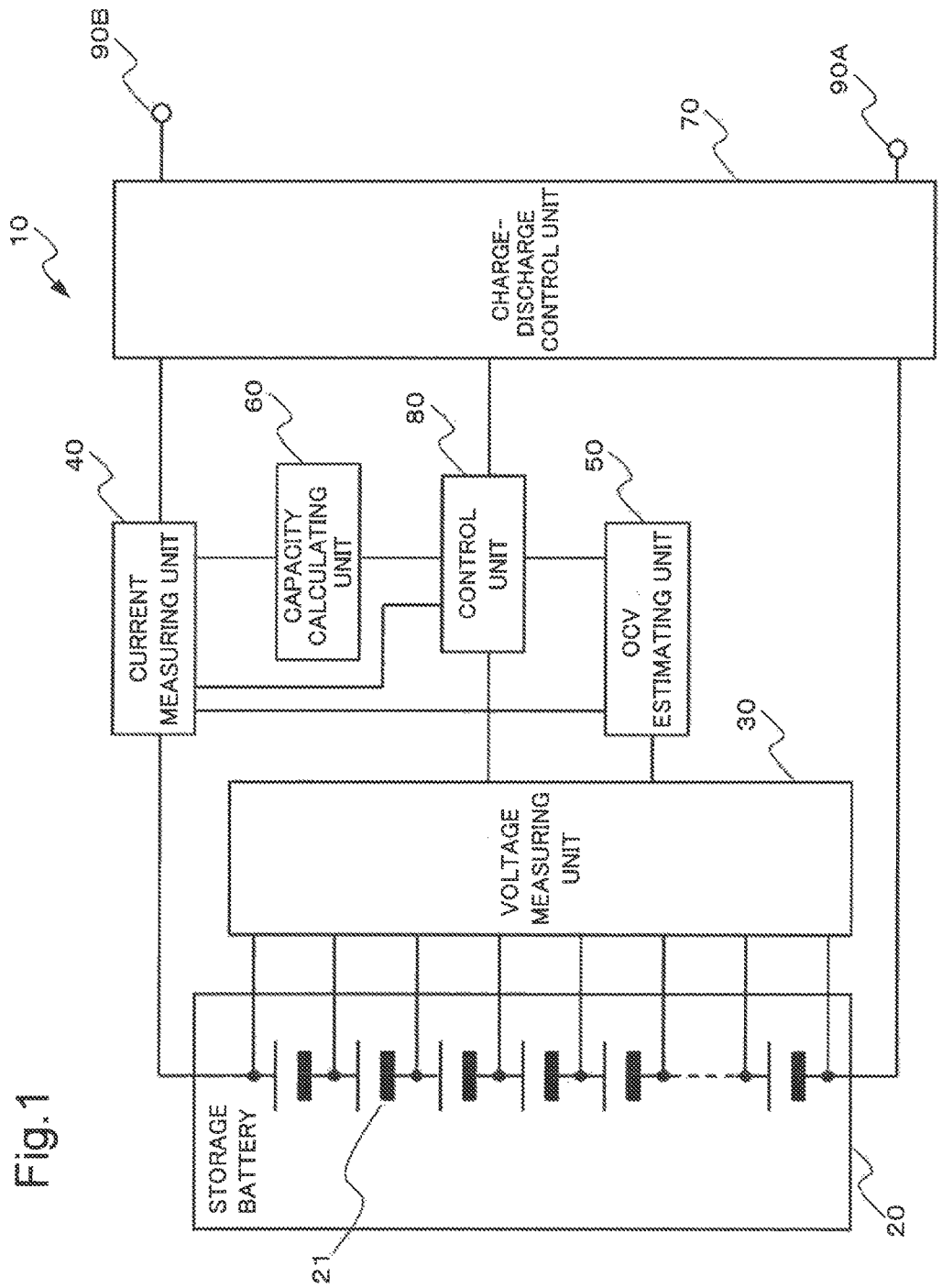
FIG. 1 is a block diagram illustrating an example of a configuration of a control device according to a first example embodiment of the present invention.

Example embodiments of the present invention will be described with reference to the drawings.

The individual drawings are for explanation of the example embodiments of the present invention. However, the present invention is not limited to each of the drawings described below. Like reference numbers are used in the drawings to indicate like components whose duplicate descriptions may be omitted.

In the drawings referred to in the descriptions below, with regarding to components irrelevant to the descriptions of the present invention, descriptions and illustrations of these components may be omitted.

The following descriptions are provided in regard to a storage battery. However, this does not mean that the target to be controlled by the control device of the present invention is limited to storage batteries. Devices to be controlled by the control device of the present invention are not limited to storage batteries but include any device that accumulates (charges) and releases (discharges) electric power. For example, target devices may include capacitor devices such as an electric double-layer capacitor, or storage battery-capacitor hybrid devices such as a lithium-ion capacitor.

Terms and variables used in the following descriptions are listed below.

"Open circuit voltage (OCV: Open circuit voltage)" is the voltage between two terminals of a storage battery to which no load is connected.

"Remaining capacity (SOC: state of charge)" is the charge rate of a storage battery, expressed by the ratio of the current state of charge (charge capacity) to the full charge. Since SOC is usually represented in percentage, it is sometimes expressed as "SOC [%]".

"Integrated capacity (Q)" is a capacity of a storage battery acquired by integrating current values (I). "$Q_{full}$" represents a full capacity. "$Q_r$" represents a reset integrated capacity. "$OCV_r$" and "$SOC_r$" respectively represent an open circuit voltage and a remaining capacity used for acquiring the $Q_r$.

"Constant current ($I_{CC}$)" represents a current in the constant current (CC: constant current) charge and in the constant-current discharge (CC discharge). The variable "i" is used for general currents throughout the descriptions below.

"T" represents a discharge time or a charge time. "ΔT" represents a difference time on a time axis. The variable "t" is used for a general time. The following descriptions use "second" as a unit of time. However, this is only for convenience of explanation. The control device 10 according to the present example embodiment may use any other unit of time than "second". In that case, the control device 10 need only modify equations used for calculations with the unit of time.

"DC (direct current)/DC converter" is a converter that converts a direct-current voltage to another direct-current voltage.

"AC (alternating current)/DC converter" is a converter that converts an alternating-current voltage to a direct-current voltage.

First Example Embodiment

A first example embodiment of the present invention will be described with reference to the drawings.

The following describes a configuration of a control device 10 according to the first example embodiment.

FIG. 1 is a block diagram illustrating an example configuration of the control device 10 according to the first example embodiment.

The control device 10 includes a storage battery 20, a voltage measuring unit 30, a current measuring unit 40, an OCV estimating unit 50, a capacity calculating unit 60, a charge-discharge control unit 70, and a control unit 80.

The storage battery 20 includes a secondary battery 21. The secondary battery 21 as used herein may be, for example, a lithium-ion rechargeable battery. Configuration of the secondary batteries 21 included in the storage battery 20 is not specifically limited. For example, the storage battery 20 may include the secondary batteries 21 that are connected in series or in parallel. Furthermore, the storage battery 20 may include the secondary batteries 21 formed in sets that are connected in series or in parallel, each set of the secondary batteries 21 being connected in series or in parallel. The storage battery 20 is connected to a negative electrode terminal 90A and to a positive electrode terminal 90B, which are electrically connected to a load being external to the control device 10.

Based on control performed by the charge-discharge control unit 70, the storage battery 20 charges the secondary battery 21 with electric power supplied from the negative electrode terminal 90A and the positive electrode terminal 90B. Alternatively, based on control performed by the charge-discharge control unit 70, the storage battery 20 discharges electric power accumulated in the secondary battery 21 from the negative electrode terminal 90A and the positive electrode terminal 90B.

The voltage measuring unit 30 measures voltage between a positive electrode and a negative electrode of the secondary battery 21 included in the storage battery 20. The voltage measuring unit 30 sends the measured voltage value (information or signal representing the value) to the OCV estimating unit 50 and to the control unit 80.

The current measuring unit 40 measures current that is flowing when the storage battery 20 is charged or discharged. As means of measuring the current, the current measuring unit 40 may use, for example, a galvanometer, a current detector with a shunt resistor, or a clamp meter. However, the present example embodiment is not limited to these detection devices. The current measuring unit 40 of the present example embodiment may use any means as long as using means for measuring a current value. The current measuring unit 40 sends the measured current value (information or signal representing the value) to the capacity calculating unit 60 and to the control unit 80.

The OCV estimating unit 50 estimates an open circuit voltage (OCV) across the storage battery 20 based on the voltage measured by the voltage measuring unit 30 and on the current measured by the current measuring unit 40. The OCV estimating unit 50 sends the estimated OCV to the control unit 80.

The capacity calculating unit 60 calculates an integrated capacity (Q) of the storage battery 20 based on the current measured by the current measuring unit 40. The capacity calculating unit 60 sends the calculated integrated capacity (Q) to the control unit 80.

The charge-discharge control unit 70 controls operations of charging and discharging the storage battery 20 based on an instruction for controlling the storage battery 20 given by the control unit 80. The charge-discharge control unit 70 is, for example, an electric power converting unit, such as a two-way DC/DC converter or AC/DC converter. More specifically, the charge-discharge control unit 70 controls current, voltage, and/or electric power during the charging and discharging of the storage battery 20, based on an instruction given by the control unit 80.

The control unit 80 sends an instruction to the charge-discharge control unit 70, based on the voltage measured by the voltage measuring unit 30, the current measured by the current measuring unit 40, the open circuit voltage (OCV) estimated by the OCV estimating unit 50, and the integrated capacity (Q) calculated by the capacity calculating unit 60, and controls the charging and discharging of the storage battery 20. Then, the control unit 80 calculates a full capacity of the storage battery 20. Operations of the control unit 80 will be later described in detail. In addition, the control unit 80 may receive a control signal (or control instruction) from an external device (not illustrated) and operate based on the control signal (or control instruction).

Next, flow of signals (information) in the control device 10 according to the present example embodiment will be described.

Figure 2:
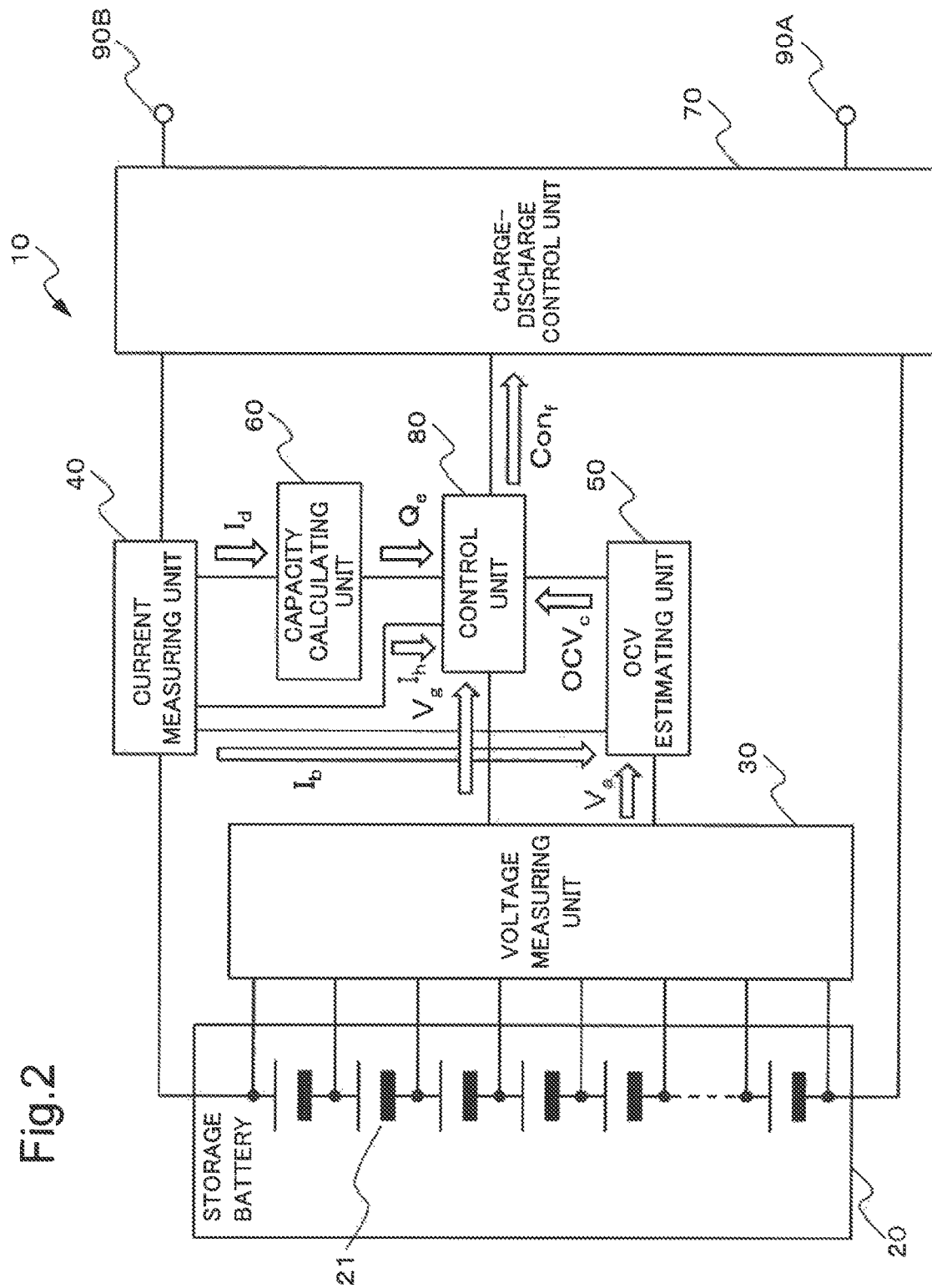
FIG. 2 illustrates an example flow of signals in the control device according to the first example embodiment.

FIG. 2 illustrates an example flow of signals in the control device 10 according to the present example embodiment.

The voltage measuring unit 30 measures voltage between terminals of each secondary battery 21 at a predetermined timing (e.g., at regular intervals). Then, the voltage measuring unit 30 sends the measured voltage value, as voltage information, to the OCV estimating unit 50 and to the control unit 80. Hereafter, when the sent voltage information is to be distinguished according to the destinations: the OCV estimating unit 50 and the control unit 80, the voltage information sent to the OCV estimating unit 50 is denoted by "$V_a$", while the voltage information sent to the control unit 80 is denoted by "$V_g$".

The voltage measuring unit 30 may send individual voltage values measured on the secondary batteries, as voltage information. Alternatively, the voltage measuring unit 30 may send an average value of the predetermined number of voltage values, as voltage information.

The voltage measuring unit 30 preferably sends the voltage information to the OCV estimating unit 50 and to the control unit 80 in synchronization with the current measuring unit 40. However, the voltage measuring unit 30 may send the voltage information at a timing different from that for the current measuring unit 40.

The voltage measuring unit 30 may also send the voltage information based on a request from the OCV estimating unit 50 or from the control unit 80.

Alternatively, the voltage measuring unit 30 may start measuring voltage based on a request from the OCV estimating unit 50 or from the control unit 80. In this case, the voltage measuring unit 30 sends information about the measured voltage upon completion of the measurement.

The current measuring unit 40 measures values of a charge current and a discharge current (hereinafter collectively denoted as a "charge-discharge current") of the storage battery 20 at a predetermined timing (e.g., at regular intervals). Then, the current measuring unit 40 sends the measured current value, as current information, to the OCV estimating unit 50, to the capacity calculating unit 60, and to the control unit 80. Hereafter, when the current information is to be distinguished according to the sending destinations: the OCV estimating unit 50, the capacity calculating unit 60, and the control unit 80, the current information sent to the OCV estimating unit 50 is denoted by "$I_b$", the current information sent to the capacity calculating unit 60 is denoted by "$I_d$", and the current information sent to the control unit 80 is denoted by "$I_h$".

The current measuring unit 40 may send the measured current value as the current information. Alternatively, the current measuring unit 40 may send an average value of the predetermined number of current values, as the current information.

The current measuring unit 40 preferably sends the current information to the OCV estimating unit 50, to the capacity calculating unit 60, and to the control unit 80 in synchronization with the voltage measuring unit 30. However, the current measuring unit 40 may send the current information at a timing different from that for the voltage measuring unit 30.

The current measuring unit 40 may also send the current information based on a request from the OCV estimating unit 50, from the capacity calculating unit 60, or from the control unit 80.

Alternatively, the current measuring unit 40 may start measuring a current value based on a request from the OCV estimating unit 50, from the capacity calculating unit 60, or from the control unit 80. In this case, the current measuring unit 40 sends information about the measured current upon completion of the measurement.

From the voltage measuring unit 30, the OCV estimating unit 50 receives the voltage information ($V_a$) between terminals of the secondary battery 21, which forms the storage battery 20.

Furthermore, the OCV estimating unit 50 receives the current information ($I_b$) in the storage battery 20 being charged or discharged, from the current measuring unit 40.

As mentioned before, the OCV estimating unit 50 preferably receives measured values in the voltage information ($V_a$) and the current information ($I_b$) at the same time in synchronization.

The OCV estimating unit 50 estimates an open circuit voltage (OCV) across the secondary battery 21, based on the voltage information ($V_a$) and the current information ($I_b$). The OCV estimating unit 50 sends the estimated OCV information (hereinafter denoted as "$OCV_c$") to the control unit 80. The estimation method used by the OCV estimating unit 50 is not specifically limited. For example, the OCV estimating unit 50 may estimate the OCV information based on an equivalent circuit model for the secondary battery 21. Alternatively, the OCV estimating unit 50 may estimate the OCV information based on the internal resistance of the secondary battery 21. Alternatively, the OCV estimating unit 50 may dynamically calculate a parameter in an equivalent circuit model for the secondary battery 21 or the internal resistance of the secondary battery 21 while the storage battery 20 is being used, and then estimate the OCV information by using the calculated value.

From the current measuring unit 40, the capacity calculating unit 60 receives the current information ($I_d$) in the storage battery 20 being charged or discharged.

Based on the current information ($I_d$), the capacity calculating unit 60 calculates a capacity, as an integral value of current, and calculates an integrated capacity by integrating the calculated capacity. Then, the capacity calculating unit 60 sends the calculated integrated capacity to the control unit 80, as integrated capacity information (hereinafter denoted as "$Q_e$"). The capacity calculating unit 60 calculates the integrated capacity by, for example, multiplying the current value at the present time by a difference time between the present time and an immediately preceding calculation time. That is, the capacity calculating unit 60 calculates the integrated capacity as a time-based integral value of a current value in the current information ($I_d$). An integral capacity is usually expressed in the unit of [Ah]. For example, the capacity calculating unit 60 integrates capacities calculated with adding the current in the charge direction and subtracting the current in the discharge direction.

The control unit 80 receives the OCV information ($OCV_c$) from the OCV estimating unit 50.

Here, the control unit 80 of the present example embodiment stores in advance remaining capacities SOC [%] in relation to open circuit voltages OCVs of the secondary battery 21 in the form of a function or a look-up table. For example, the control unit 80 stores the function or look-up table in the control unit 80 or in a memory (not illustrated) connected to the control unit 80.

Figure 3:
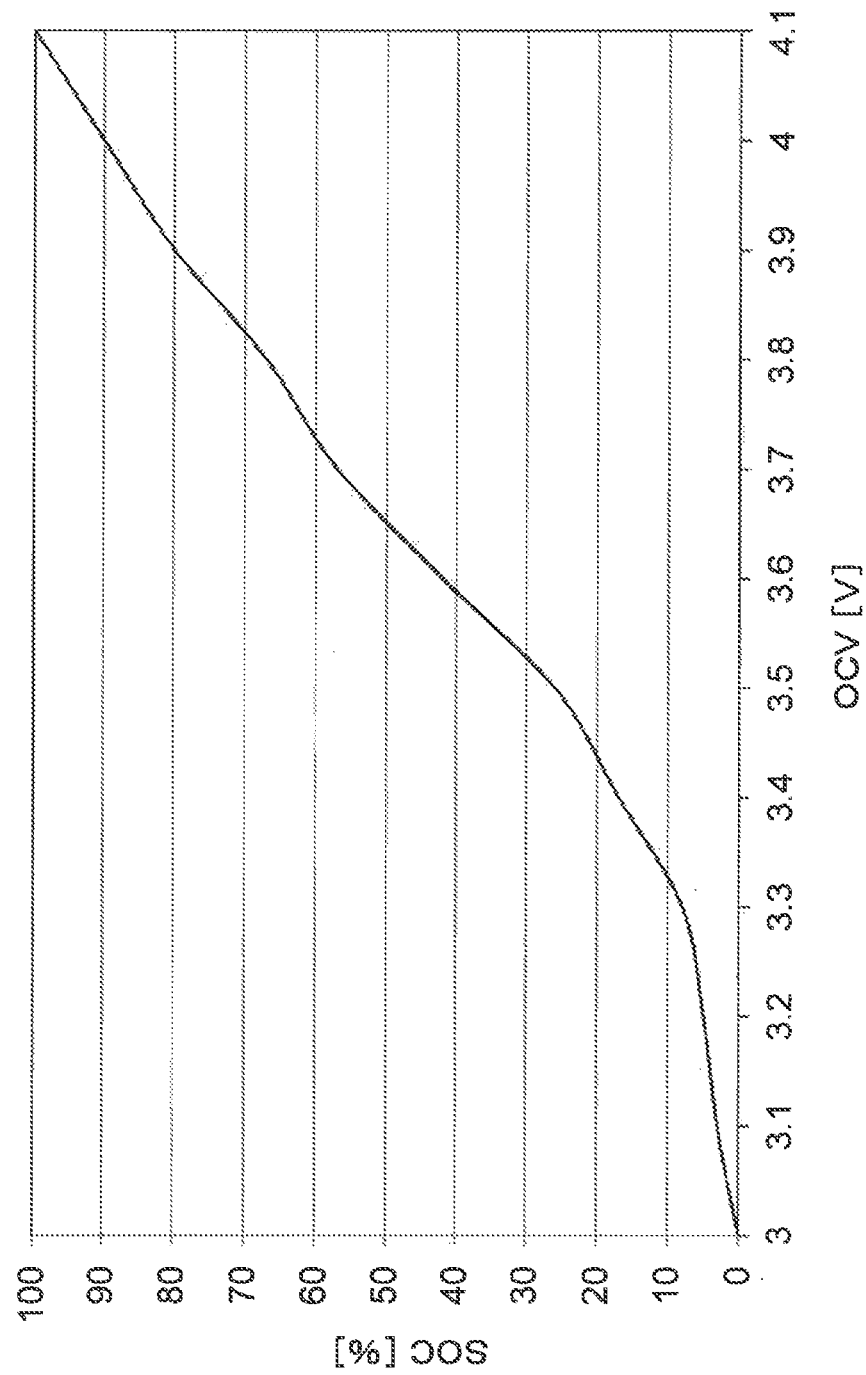
FIG. 3 illustrates an example relationship between an open circuit voltage OCV and a remaining capacity SOC [%] according to the first example embodiment.

FIG. 3 illustrates an example relationship between open circuit voltage OCV and remaining capacity SOC [%] (hereinafter referred to as "OCV-SOC [%]").

The control unit 80 stores a look-up table created based on the OCV-SOC [%] relationship illustrated in FIG. 3 or a function representing the OCV-SOC [%] relationship illustrated in FIG. 3. Based on the stored function or the stored look-up table, the control unit 80 calculates a remaining capacity SOC in relation to the received OCV information ($OCV_c$). When the storage battery 20 includes a plurality of secondary batteries 21 connected in series, the control unit 80 may calculate an average value of the open circuit voltages OCVs of the secondary batteries 21, and then calculate a remaining capacity SOC [%] by using the calculated average value as the open circuit voltage OCV.

Meanwhile, the control unit 80 receives the integrated capacity information ($Q_e$) from the capacity calculating unit 60.

Then, the control unit 80 sends charge-discharge control information (hereinafter denoted as "$Con_f$") to the charge-discharge control unit 70. The charge-discharge control information ($Con_f$) includes operation mode settings for the charge-discharge control unit 70, such as the discharge or charge mode in which the charge-discharge control unit 70 discharges or charges the storage battery 20. Alternatively, the charge-discharge control information ($Con_f$) may include a discharge setting while discharging or a charge setting while charging in of the charge-discharge control unit 70.

The control unit 80 may also receive, from the charge-discharge control unit 70, the measurement information such as a current or a voltage which the charge-discharge control unit 70 acquires in controlling the charge-discharge of the storage battery 20.

As mentioned before, the control unit 80 preferably receives the voltage information ($V_g$) from the voltage measuring unit 30 in synchronization with the OCV information ($OCV_c$) from the OCV estimating unit 50.

In addition, the control unit 80 holds in advance the range of voltages at which the secondary battery 21 forming the storage battery 20 is chargeable-dischargeable. For example, when the secondary battery 21 is a single electric cell of a lithium-ion secondary battery, the range of chargeable-dischargeable voltages is 2.5 to 4.2 V. Then, the control unit 80 determines whether the value of voltage across the secondary battery 21 in the voltage information ($V_g$) received from the voltage measuring unit 30 falls within the range of chargeable-dischargeable voltages. When the value of voltage across the secondary battery 21 is out of the range of chargeable-dischargeable voltages, the control unit 80 sends an instruction to the charge-discharge control unit 70 to stop charging or discharging the storage battery 20. Based on these operations, the control unit 80 prevents over-discharge and over-charge of the battery being charged and discharged.

Furthermore, the control unit 80 holds in advance the range of currents permissible when the storage battery 20 is charged and discharged. The control unit 80 determines whether the current value in the current information ($I_h$) received from the current measuring unit 40 falls within the range of permissible currents. When the current in the storage battery 20 is out of the range of permissible currents, the control unit 80 sends an instruction to the charge-discharge control unit 70 to stop charging or discharging the storage battery 20. Based on these operations, the control unit 80 performs control so as to prevent an excess current out of specifications from flowing into the secondary battery 21 included in the storage battery 20.

Next, operations of the control device 10 will be described with reference to the drawings.

Figure 4:
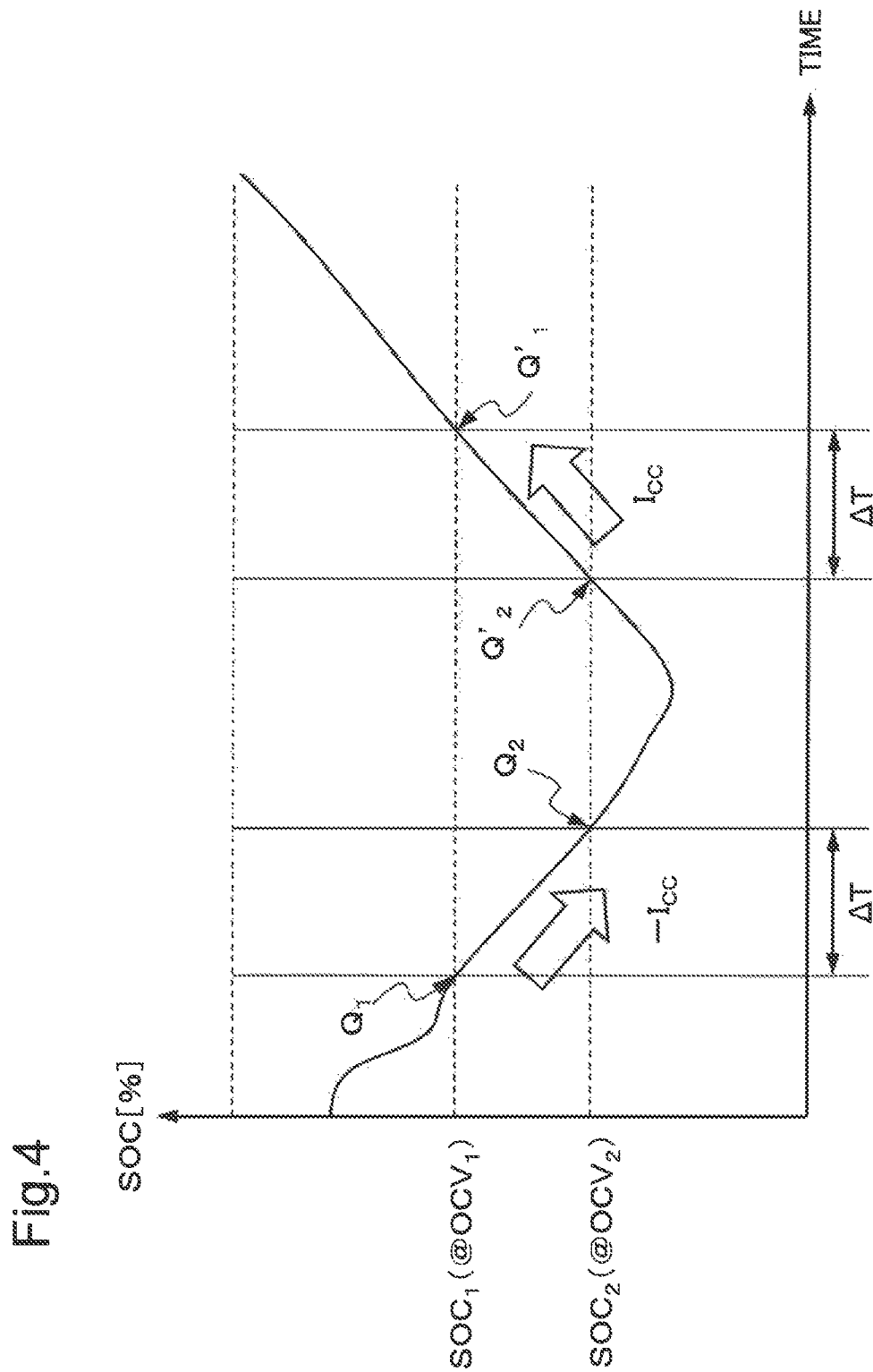
FIG. 4 is an explanatory diagram illustrating operations of the control device according to the first example embodiment.

FIG. 4 is an explanatory diagram for illustrating operations of the control device 10 according to the present example embodiment. FIG. 4 illustrates time change of the remaining capacity SOC [%] calculated from the open circuit voltages OCVs in relation to discharge operation and charge operation when the control device 10 is detecting a full capacity. In FIG. 4, a remaining capacity SOC calculated from the open circuit voltage OCV is denoted as "SOC (@OCV)".

First, the control unit 80 instructs the discharge mode to the charge-discharge control unit 70. During the discharge mode, the charge-discharge control unit 70 does not perform to charge the storage battery 20 but performs to discharge the storage battery 20. In addition, the control unit 80 instructs the charge-discharge control unit 70 to discharge at a constant current ($I_{CC}$), i.e., perform the CC discharge, at least between a first open circuit voltage $OCV_1$ and a second open circuit voltage $OCV_2$. The first open circuit voltage $OCV_1$ and the second open circuit voltage $OCV_2$ are any two voltage levels falling within the range of voltages OCVs relating to the remaining capacities SOC [%] of 0 to 100%. For example, when the secondary battery 21 is a single electric cell of a lithium-ion secondary battery, the first open circuit voltage $OCV_1$ and the second open circuit voltage $OCV_2$ ($<OCV_1$) may be any two voltage levels falling within the range of 3.0 to 4.1 V. When the first and second open circuit voltages $OCV_1$ and $OCV_2$ are voltages passing through charging or discharging in general use of the storage battery, the control unit 80 can detect the first and second open circuit voltages $OCV_1$ and $OCV_2$ while the storage battery is in general use.

During the discharging, the control unit 80 receives the OCV information ($OCV_c$) from the OCV estimating unit 50. When the OCV reaches the first open circuit voltage $OCV_1$, the control unit 80 calculates a first remaining capacity SOC$_1$ [%] based on the stored OCV-SOC [%] relationship. In addition, the control unit 80 receives the integrated capacity information (Q$_e$) from the capacity calculating unit 60. The integrated capacity information (Q$_e$) received at this time point is hereinafter denoted as a first integrated capacity (Q$_1$).

Uninterruptedly, the control unit 80 continues the discharging. The control unit 80 receives the OCV$_c$ from the OCV estimating unit 50. When the OCV$_c$ reaches the second open circuit voltage OCV$_2$, the control unit 80 calculates a second remaining capacity SOC$_2$ [%] based on the stored OCV-SOC [%] relationship. In addition, the control unit 80 receives the integrated capacity information (Q$_e$) from the capacity calculating unit 60. The integrated capacity information (Q$_e$) received at this time point is hereinafter denoted as a second integrated capacity (Q$_2$).

Next, the control unit 80 instructs the charge-discharge control unit 70 to stop discharging the battery. Then, the control unit 80 instructs the charge mode to the charge-discharge control unit 70. In addition, the control unit 80 instructs the charge-discharge control unit 70 to charge at a constant current (I$_{CC}$), i.e., perform the CC charge, between the first open circuit voltage OCV$_1$ and the second open circuit voltage OCV$_2$.

During the charging, the control unit 80 receives the OCV information (OCV$_c$) from the OCV estimating unit 50. When the OCV$_c$ reaches the second open circuit voltage OCV$_2$, the control unit 80 calculates a second remaining capacity SOC$_2$ [%] based on the stored OCV-SOC [%] relationship. The SOC$_2$ [%] at this time is equal to the SOC$_2$ [%] during the discharging. Thus, the control unit 80 may omit the calculation of the SOC$_2$ [%] during the charging. Alternatively, the control unit 80 may omit the calculation of the SOC$_2$ [%] during the discharging, and calculate the SOC$_2$ [%] during the charging.

In addition, the control unit 80 receives the integrated capacity information (Q$_e$) from the capacity calculating unit 60. The integrated capacity information (Q$_e$) received at this time point is hereinafter denoted as a third integrated capacity (Q'$_2$).

Uninterruptedly, the control unit 80 continues the charging. The control unit 80 receives the OCV$_c$ from the OCV estimating unit 50. When the OCV$_c$ reaches the first open circuit voltage OCV$_1$, the control unit 80 calculates a first remaining capacity SOC$_1$ [%] based on the stored OCV-SOC [%] relationship. The SOC$_1$ [%] at this time is equal to the SOC$_1$ [%] during the discharge. Thus, the control unit 80 may omit the calculation of the SOC$_1$ [%] during the charging. Alternatively, the control unit 80 may omit the calculation of the SOC$_1$ [%] during the discharging, and calculates the SOC$_1$ [%] during the charging.

In addition, the control unit 80 receives the integrated capacity information (Q$_e$) from the capacity calculating unit 60. The integrated capacity information (Q$_e$) received at this time point is hereinafter denoted as a fourth integrated capacity (Q'$_1$).

Then, the control unit 80 calculates a full capacity the Q$_{full}$ based on the first remaining capacity SOC$_1$ [%], the second remaining capacity SOC$_2$ [%], the first integrated capacity Q$_1$, the second integrated capacity Q$_2$, the third integrated capacity Q'$_2$, and the fourth integrated capacity Q'$_1$. For example, the control unit 80 calculates the full capacity Q$_{full}$ by using Equation 1 below:

$$Q_{full} = \frac{((Q_1 - Q_2) + (Q'_1 - Q'_2))}{2} \Big/ \frac{SOC_1 - SOC_2}{100} \quad \text{[Equation 1]}$$

When charging and discharging at a constant current value (I$_{CC}$ (>0) [A]) between the first open circuit voltage OCV$_1$ [V] and the second open circuit voltage OCV$_2$ [V], the charge time and the discharge time between the first open circuit voltage OCV$_1$ and the second open circuit voltage OCV$_2$ are equal. These charge time and discharge time are hereinafter denoted as "ΔT (unit is second)".

Currents i(t) [A] and i'(t) [A], which are measured by the current measuring unit 40 during the discharging and the charging are expressed by Equation 2 below:

$$i(t) = i_{real}(t) + i_{offset}$$

$$i'(t) = i'_{real}(t) + i_{offset} \quad \text{[Equation 2]}$$

In Equation 2, i$_{offset}$ [A] is an offset included in a current value measured by the current measuring unit 40. i$_{real}$(t) [A] and i'$_{real}$(t) [A] are values acquired by removing the offset from a current measured during the discharging and charging.

As described earlier, t is a variable representing time. For convenience of explanation, the time at the time point of the first open circuit voltage OCV$_1$ [V] during the discharging is expressed as "0". Likewise, the time at the time point of the second open circuit voltage OCV$_2$ [V] during the charging is expressed as "0". The charge time and discharge time each are represented by "Δt (unit is second)", as mentioned above. Thus, the range of time "t" in the charge time or discharge time is expressed as "0≤t≤ΔT".

In this time, the amount of change in integrated capacity from the first open circuit voltage OCV$_1$ [V] to the second open circuit voltage OCV$_2$ [V] during the discharging is expressed by Equation 3 below:

$$\begin{aligned} Q_1 - Q_2 [Ah] &= -\int_0^{\Delta T} i(t) dt / 3600 \\ &= \frac{-\int_0^{\Delta T} (i_{real}(t) + i_{offset}) dt}{3600} \\ &= \frac{-\int_0^{\Delta T} i_{real}(t) dt - i_{offset} \cdot \Delta T}{3600} \end{aligned} \quad \text{[Equation 3]}$$

On the other hand, the amount of change in integrated capacity during the charging is expressed by Equation 4 below:

$$\begin{aligned} Q'_1 - Q'_2 [Ah] &= \int_0^{\Delta T} i'(t) dt / 3600 \\ &= \frac{\int_0^{\Delta T} (i'_{real}(t) + i_{offset}) dt}{3600} \\ &= \frac{\int_0^{\Delta T} i'_{real}(t) dt + i_{offset} \cdot \Delta T}{3600} \end{aligned} \quad \text{[Equation 4]}$$

Then, an average value of the amount of change in integrated capacity during the discharging and the amount of change in integrated capacity during charging is expressed by Equation 5 below:

$$\frac{(Q_1 - Q_2) + (Q'_1 - Q'_2)}{2} [Ah] = \frac{\int_0^{\Delta T} i'_{real}(t) dt - \int_0^{\Delta T} i_{real}(t) dt}{2 \times 3600} \quad \text{[Equation 5]}$$

$$= \frac{\int_0^{\Delta T} I_{CC} dt - \int_0^{\Delta T} (-I_{CC}) dt}{2 \times 3600}$$

$$= \frac{2 I_{CC} \cdot \Delta T}{2 \times 3600}$$

$$= \frac{I_{CC} \cdot \Delta T}{3600}$$

$$= \Delta Q_{12}$$

The average value of the amount of change in integrated capacity during the discharging and the amount of change in integrated capacity during the charging is canceled out the offset components in the current values measured by the current measuring unit 40. In this way, because the control unit 80 uses the average value of the amount of change in integrated capacity during the discharging and the amount of change in integrated capacity during the charging, the control unit 80 can calculate the amount of change in the integrated capacity eliminating the influence of an offset.

The calculated amount of change in the integrated capacity further brings the full capacity ($Q_{full}$) as expressed by Equation 6 below:

$$Q_{full}[Ah] = \Delta Q_{12} \Big/ \frac{SOC_1 - SOC_2}{100} \quad \text{[Equation 6]}$$

$$= \frac{(Q_1 - Q_2) + (Q'_1 - Q'_2)}{2} \Big/ \frac{SOC_1 - SOC_2}{100}$$

Equation 6 is identical to Equation 1.

Hence, the control unit 80 can calculate a correct full capacity even when an offset is included in a current value measured by the current measuring unit 40.

Furthermore, the control unit 80 may have a full capacity detection mode in addition to the ordinary operation mode. For example, the control unit 80 may operate so as to switch the operation mode of the control device 10 from the ordinary operation mode to the full capacity detection mode, perform the discharging and charging of the storage battery 20 in relation to detection of a full capacity, calculate a full capacity, and after the calculation, return the full capacity detection mode to the ordinary operation mode.

Alternatively, during the ordinary operation mode in which the ordinary charge-discharge is performed, the control unit 80 may perform discharge and charge of the storage battery 20 in relation to detection of a full capacity. For example, the storage battery 20 installed for household use usually repeats the operations of: charging with electricity generated by solar power generation or the like during daytime, discharging the electricity charged in daytime for us in the home during nighttime, and charging again during time zone when electricity charges are low in midnight. Thus, the control device 10 can detect a full capacity of the storage battery 20 installed for household use during the ordinary use.

The control device 10 may change the order of discharging and charging. That is, the control device 10 may control the storage battery 20 so that it is charged and then discharged for calculating a full capacity.

Effects of the present example embodiment are described below.

The control device 10 according to the first example embodiment can achieve an effect of correctly calculating a full capacity even when an offset is included in a measured current value. In addition, the control device 10 according to the first example embodiment can achieve an effect of calculating a full capacity in a short time.

The reasons are as follows.

The voltage measuring unit 30 measures voltages ($V_a$ and $V_g$) across the secondary battery 21 included in the storage battery 20. The current measuring unit 40 measures currents ($I_b$, $I_d$, and $I_h$) in the storage battery 20. The OCV estimating unit 50 estimates an open circuit voltage ($OCV_c$) based on the voltage ($V_a$) and the current ($I_b$). The capacity calculating unit 60 calculates an integrated capacity ($Q_e$) based on the current ($I_d$).

Then, the control unit 80 discharges and charges the storage battery 20 by controlling the charge-discharge control unit 70 based on the voltage ($V_g$) and the current ($I_h$) to. Then, the control unit 80 calculates a first SOC and a second SOC, which are remaining capacities (SOC) between predetermined first OCVs (first open circuit voltage $OCV_{1S}$) and predetermined second OCVs (second open circuit voltage $OCV_{2S}$) during the discharging and the charging of the storage battery 20. The first SOC and the second SOC are equivalent to the first remaining capacity $SOC_1$ and the second $SOC_2$, respectively, appearing in the above descriptions. In addition, the control unit 80 receives, from the capacity calculating unit 60, a first integrated capacity ($Q_1$) and a second integrated capacity ($Q_2$), which represent integrated capacities ($Q_a$) at the first OCV and the second OCV during the discharging. In addition, the control unit 80 receives, from the capacity calculating unit 60, a third integrated capacity ($Q'_2$) and a fourth integrated capacity ($Q'_1$), which represent integrated capacities ($Q_a$) at the second OCV and the s OCV during the charging. Then, the control unit 80 calculates a full capacity ($Q_{full}$) based on the first SOC, the second SOC, and the first to fourth integrated capacities. The foregoing calculation of a full capacity based on the first SOC, the second SOC, and the first to fourth integrated capacities as performed by the control unit 80 is equivalent to calculation of a full capacity ($Q_{full}$) by using an average value of the amounts of change in integrated capacity ($Q_e$) during the discharging and the charging of the storage battery 20. The average value of the amounts of change in integrated capacities ($Q_e$) during the discharging and the charging cancels out an offset ($I_{offset}$) in a current. Accordingly, the control unit 80 can calculate a correct full capacity even when an offset is included in a measured current.

Furthermore, the control device 10 according to the first example embodiment does not have to provide a waiting time for measuring a no-load voltage. Accordingly, the control device 10 can shorten a time for calculating a full capacity.

Variation Example 1

The control device 10 described above is configured as below.

For example, the individual component units of the control device 10 may be configured with hardware circuitry.

Alternatively, the control device 10 may configure individual component units of the control device 10 by using a plurality of devices connected via a network or a bus.

Figure 5:
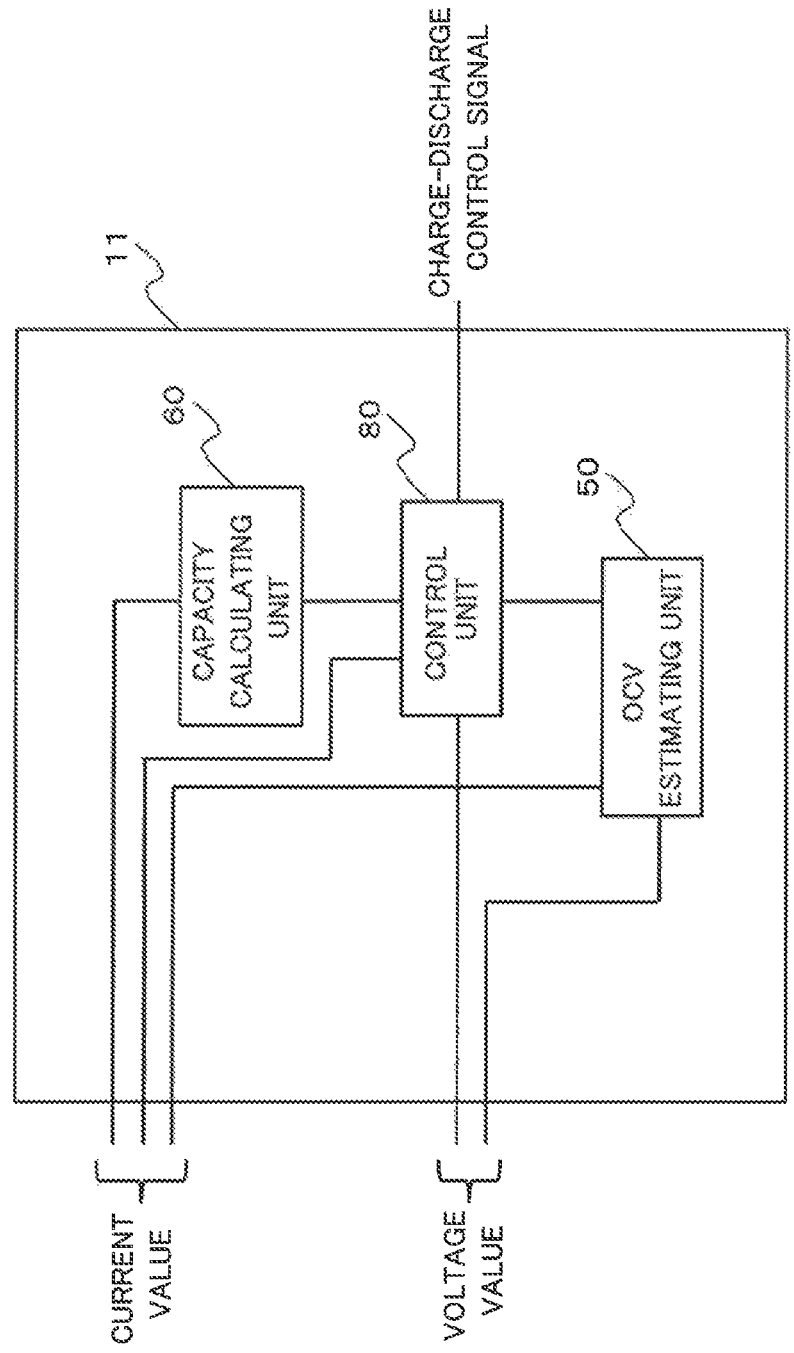
FIG. 5 is a block diagram illustrating another example configuration of the control device according to the first example embodiment.

FIG. 5 is a block diagram illustrating an example configuration of the control device 11 according to the present variation example 1.

The control device 11 illustrated in FIG. 5 includes the OCV estimating unit 50, the capacity calculating unit 60, and the control unit 80. The control device 11 is connected, via a network or a bus, to the storage battery 20, the voltage measuring unit 30, the current measuring unit 40, and the charge-discharge control unit 70 which are mounted on another device (not illustrated).

The individual components illustrated in FIG. 5 are similar to those illustrated in FIG. 1.

More particularly, the components are as described below.

The OCV estimating unit 50 receives the voltage value ($V_a$) from the voltage measuring unit 30 (not illustrated) and the current value ($I_b$) from the current measuring unit 40.

The capacity calculating unit 60 receives the current value ($I_d$) from the current measuring unit 40 (not illustrated).

The control unit 80 sends the charge-discharge control signal ($Con_f$) to the charge-discharge control unit 70 (not illustrated), operates in a similar manner to the control unit 80 in the control device 10, and calculates the full capacity of the storage battery 20 (not illustrated).

The control device 11 configured in this way can achieve effects similar to those provided by the control device 10.

This is because the control device 11 can achieve functions similar to those of the OCV estimating unit 50, the capacity calculating unit 60, and the control unit 80 included in the control device 10.

The control device 11 represents a minimum configuration of the present invention.

Variation Example 2

A plurality of component units included in the control device 10 may be configured with a single piece of hardware.

The control device 10 may be implemented in the form of a computer device which includes a CPU (central processing unit), a ROM (read-only memory), and a RAM (random access memory). The control device 10 may also be implemented in the form of a computer device that includes an input/output connection circuit (IOC) and a network interface circuit (NIC), in addition the aforementioned components.

Figure 6:
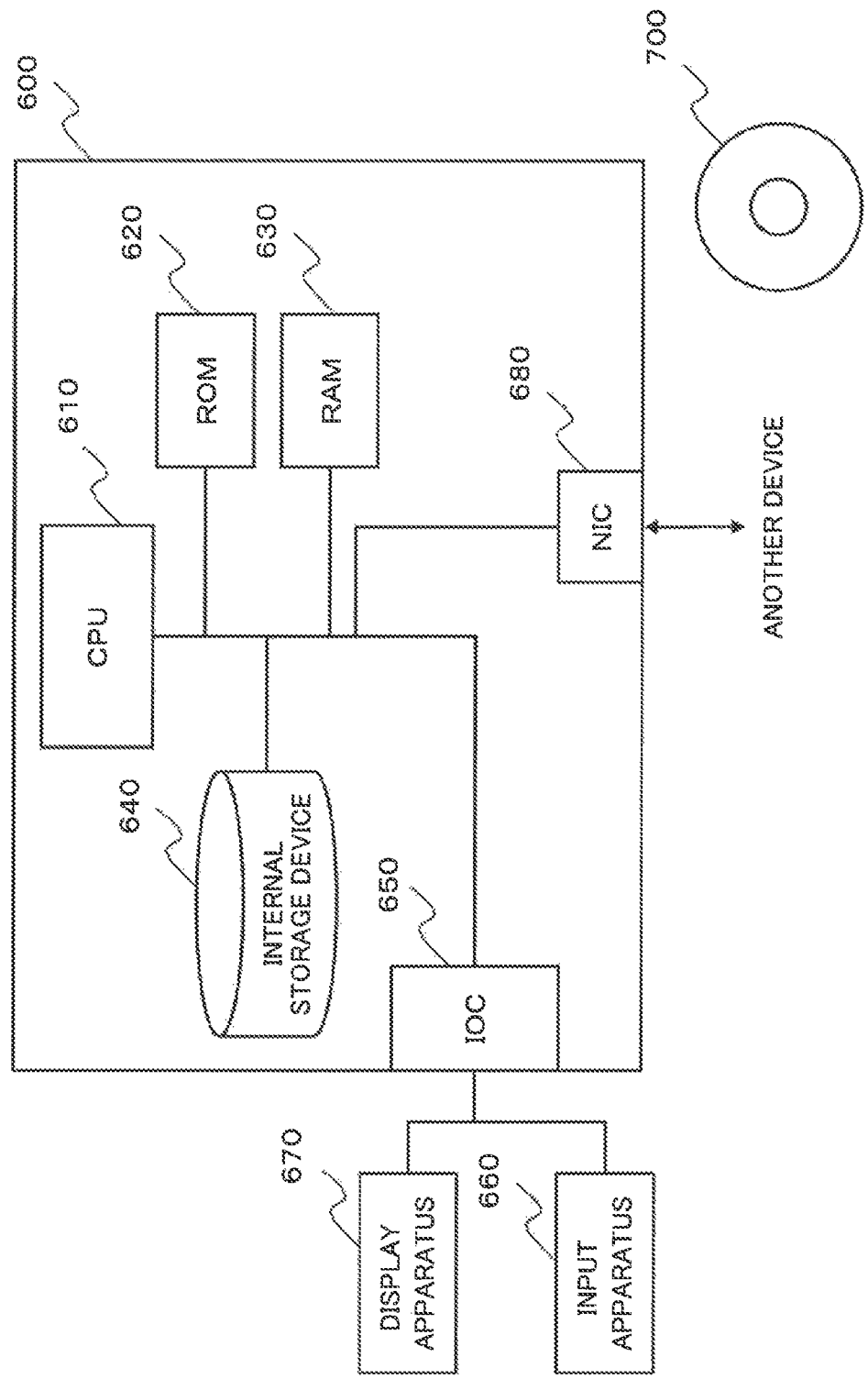
FIG. 6 is a block diagram illustrating more another example configuration of the control device according to the first example embodiment.

FIG. 6 is a block diagram illustrating an example configuration of the control device 600 according to the present variation example.

The control device 600 includes a CPU 610, a ROM 620, a RAM 630, an internal storage device 640, an IOC 650, and an NIC 680 to form a computer device. The storage battery 20 and the like are omitted in FIG. 6.

The CPU 610 reads a program from the ROM 620. Based on the read program, the CPU 610 controls the RAM 630, the internal storage device 640, the IOC 650, and the NIC 680. By controlling these components, the computer including the CPU 610 achieves the individual functions as the OCV estimating unit 50, the capacity calculating unit 60, and the control unit 80 illustrated in FIGS. 1 and 5. The computer including the CPU 610 may also implement at least part of the functions as the voltage measuring unit 30, the current measuring unit 40, and the charge-discharge control unit 70. For example, the control device 600 may include a DC/DC converter (not illustrated), control the DC/DC converter, and achieves the functions of the charge-discharge control unit 70. Alternatively, the control device 600 may achieve the functions as the charge-discharge control unit 70 by controlling a converter (not illustrated) connected to the storage battery 20.

When achieving the individual functions, the CPU 610 may use the RAM 630 or the internal storage device 640 as a temporary storage for programs.

Alternatively, the CPU 610 may read a program included in a storage medium 700 that stores the program in a computer-readable manner by use a storage medium reading device (not illustrated). Alternatively, the CPU 610 may receive a program from an external device (not illustrated) via the NIC 680, save it in the RAM 630, and operate based on the saved program.

The ROM 620 stores a program to be executed by the CPU 610 and fixed data. The ROM 620 is, for example, a P-ROM (programmable-ROM) or a flash ROM.

The RAM 630 temporarily stores a program to be executed by the CPU 610 and data. The RAM 630 is, for example, a D-RAM (dynamic-RAM).

The internal storage device 640 stores data and programs to be saved for a long time by the control device 600. Additionally, the internal storage device 640 may perform as a temporary storage device for the CPU 610. The internal storage device 640 is, for example, a hard disk device, a magneto-optical disk device, an SSD (solid state drive), or a disk array device.

The ROM 620 and the internal storage device 640 are non-transitory storage media. On the other hand, the RAM 630 is a transitory storage medium. The CPU 610 can operate based on a program stored in the ROM 620, the internal storage device 640, or the RAM 630. In other words, the CPU 610 can operate using a non-transitory storage medium or a transitory storage medium.

The IOC 650 intermediates data between the CPU 610 and each of an input apparatus 660 and a display apparatus 670. The IOC 650 is, for example, an IO interface card or a USB (Universal Serial Bus) card.

The input apparatus 660 is an apparatus for receiving input instructions from an operator of the control device 600. The input apparatus 660 is, for example, a keyboard, mouse, or touch panel.

The display apparatus 670 is an apparatus presenting information to the operator of the control device 600. The display apparatus 670 is, for example, a liquid crystal display.

The NIC 680 relays data exchange with an external device (not illustrated) via a network. The NIC 680 is, for example, an LAN (local area network) card.

The control device 600 configured in this way can achieve effects similar to those provided by the control device 10 and the control device 11.

This is because the CPU 610 in the control device 600 can achieve, based on a program, the functions similar to those of the OCV estimating unit 50, the capacity calculating unit 60, the charge-discharge control unit 70, and the control unit 80 included in the control devices 10 and 11. Furthermore, the CPU 610 in the control device 600 can achieve, based on a program, the functions similar to those of the voltage measuring unit 30, the current measuring unit 40, and the charge-discharge control unit 70 included in the control device 10.

Second Example Embodiment

A second example embodiment of the present invention will be described.

The configuration of a control device 10 according to the present example embodiment is similar to that of the control device 10 of the first example embodiment, and thus its detail descriptions are omitted. Variables appearing in the following descriptions are also similar to those of the first example embodiment. The control device 10 of the present example embodiment may be implemented with the computer illustrated in FIG. 6.

Figure 7:
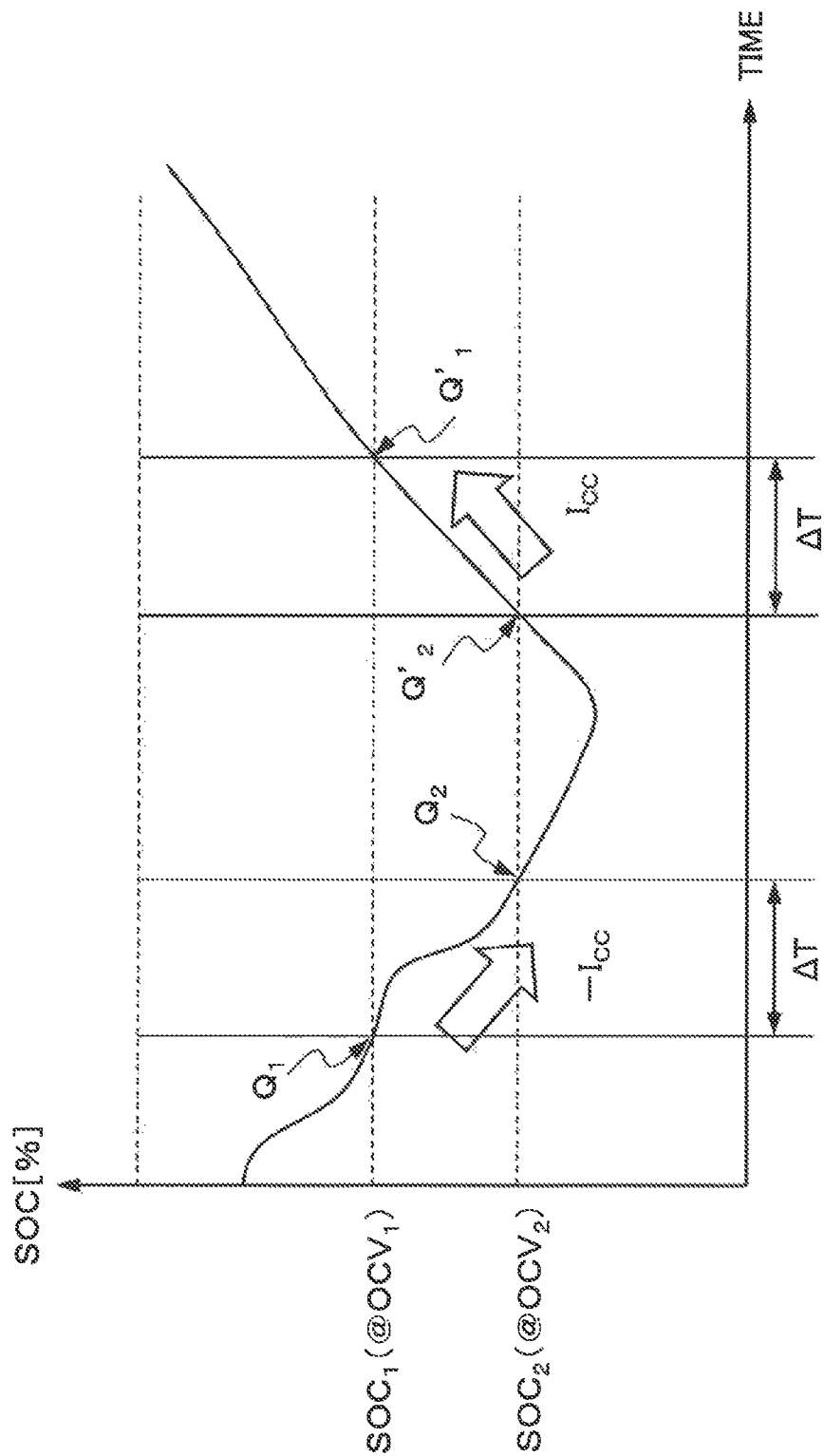
FIG. 7 is an explanatory diagram illustrating operations of the control device according to a second example embodiment.

FIG. 7 is an explanatory diagram for illustrating operations of the control device 10 according to the present example embodiment. FIG. 7 illustrates the remaining capacity SOC [%] that varies with time as calculated from the open circuit voltages OCVs in relation to discharge and charge operations when the control device 10 of the present example embodiment is detecting the full capacity ($Q_{full}$).

First, the control unit 80 instructs the discharge mode to the charge-discharge control unit 70. During the discharge mode, the charge-discharge control unit 70 does not charge the storage battery 20, but discharges the storage battery 20.

During the discharging, the control unit 80 receives the OCV information ($OCV_c$) from the OCV estimating unit 50. When the OCV reaches the first open circuit voltage $OCV_1$, the control unit 80 calculates the first remaining capacity $SOC_1$ [%] based on the stored OCV-SOC [%] relationship. In addition, the control unit 80 receives the integrated capacity information ($Q_e$) from the capacity calculating unit 60. The integrated capacity information ($Q_e$) received at this time point is the first integrated capacity ($Q_1$).

When the $OCV_c$ reaches the first open circuit voltage $OCV_1$, the control unit 80 instructs the charge-discharge control unit 70 to start calculating an average current.

Based on the instruction from the control unit 80, the charge-discharge control unit 70 starts the process of calculating an average discharge current.

Uninterruptedly, the control unit 80 continues the discharging. The control unit 80 receives the $OCV_c$ from the OCV estimating unit 50. When the $OCV_c$ reaches the second open circuit voltage $OCV_2$, the control unit 80 calculates the second remaining capacity $SOC_2$ [%] based on the stored OCV-SOC [%] relationship. In addition, the control unit 80 receives the integrated capacity information ($Q_e$) from the capacity calculating unit 60. The integrated capacity information ($Q_e$) received at this time point is the second integrated capacity ($Q_2$).

When the $OCV_c$ reaches the second open circuit voltage $OCV_2$, the control unit 80 instructs the charge-discharge control unit 70 to stop calculating an average current.

Based on the instruction from the control unit 80, the charge-discharge control unit 70 calculates an average of currents from the start instructions to the stop instruction. The average current represents an average discharge current. The charge-discharge control unit 70 sends the calculated average discharge current to the control unit 80. The charge-discharge control unit 70 may also hold the calculated average discharge current.

Next, the control unit 80 instructs the charge-discharge control unit 70 to stop discharging the battery. Then, the control unit 80 instructs the charge mode to the charge-discharge control unit 70. The control unit 80 further instructs the charge-discharge control unit 70 to charge the battery at a constant current, i.e., perform CC charge. Note that, the absolute value of the current value here is equal to the absolute value of the average discharge current received by the control unit 80 from the charge-discharge control unit 70. Alternatively, the control unit 80 may instruct the charge-discharge control unit 70 to charge the battery with an average current value (hereinafter denoted as "average charge current") so that its absolute value is equal to the absolute value of the average discharge current. When the charge-discharge control unit 70 holds the average discharge current, the control unit 80 may instruct the charge-discharge control unit 70 to charge the battery with the average current held in the charge-discharge control unit 70.

During the charging, the control unit 80 receives the OCV information ($OCV_c$) from the OCV estimating unit 50. When the $OCV_c$ reaches the second open circuit voltage $OCV_2$, the control unit 80 calculates the second remaining capacity $SOC_2$ [%] based on the stored OCV-SOC [%] relationship. In addition, the control unit 80 receives the integrated capacity information ($Q_e$) from the capacity calculating unit 60. The integrated capacity information ($Q_e$) received at this time point is the third integrated capacity ($Q'_2$).

Uninterruptedly, the control unit 80 continues the charging. The control unit 80 receives the $OCV_c$ from the OCV estimating unit 50. When the $OCV_c$ reaches the first open circuit voltage $OCV_1$, the control unit 80 calculates the first remaining capacity $SOC_1$ [%] based on the stored OCV-SOC [%] relationship. In addition, the control unit 80 receives the integrated capacity information ($Q_e$) from the capacity calculating unit 60. The integrated capacity information ($Q_e$) received at this time point is the fourth integrated capacity ($Q'_1$).

Then, the control unit 80 calculates the full capacity $Q_{full}$ by using Equation 1, based on the first remaining capacity $SOC_1$ [%], the second remaining capacity $SOC_2$ [%], the first integrated capacity $Q_1$, the second integrated capacity $Q_2$, the third integrated capacity $Q'_2$, and the fourth integrated capacity $Q'_1$.

Effects of the second example embodiment are described below.

In addition to the effects provided by the first example embodiment, the control device 10 of the present example embodiment can achieve an effect of reducing control of currents in the measuring range (i.e., during the discharging or the charging between the first open circuit voltage $OCV_1$ and the second open circuit voltage $OCV_2$).

The reasons are as follows.

The charge-discharge control unit 70 in the control device 10 of the present example embodiment calculates an average current during the discharging. Thus, the control unit 80 need not instruct the charge-discharge control unit 70 to discharge at a constant current. In addition, the charge-discharge control unit 70 charges the battery with the average current of the same value (absolute value) as that of the average discharge current. Accordingly, since the charge time is equal to the discharge time, the control device 10 can calculate the full capacity ($Q_{full}$) by using the equation similar to that of the first example embodiment.

Third Example Embodiment

A third example embodiment of the present invention will be described.

The configuration of a control device 10 according to the present example embodiment is similar to those of the control device 10 of the first and second example embodiments, and thus its detail descriptions are omitted. Variables appearing in the following descriptions are also similar to those of the first example embodiment. The control device 10 of the present example embodiment may be implemented with the computer illustrated in FIG. 6.

Figure 8:
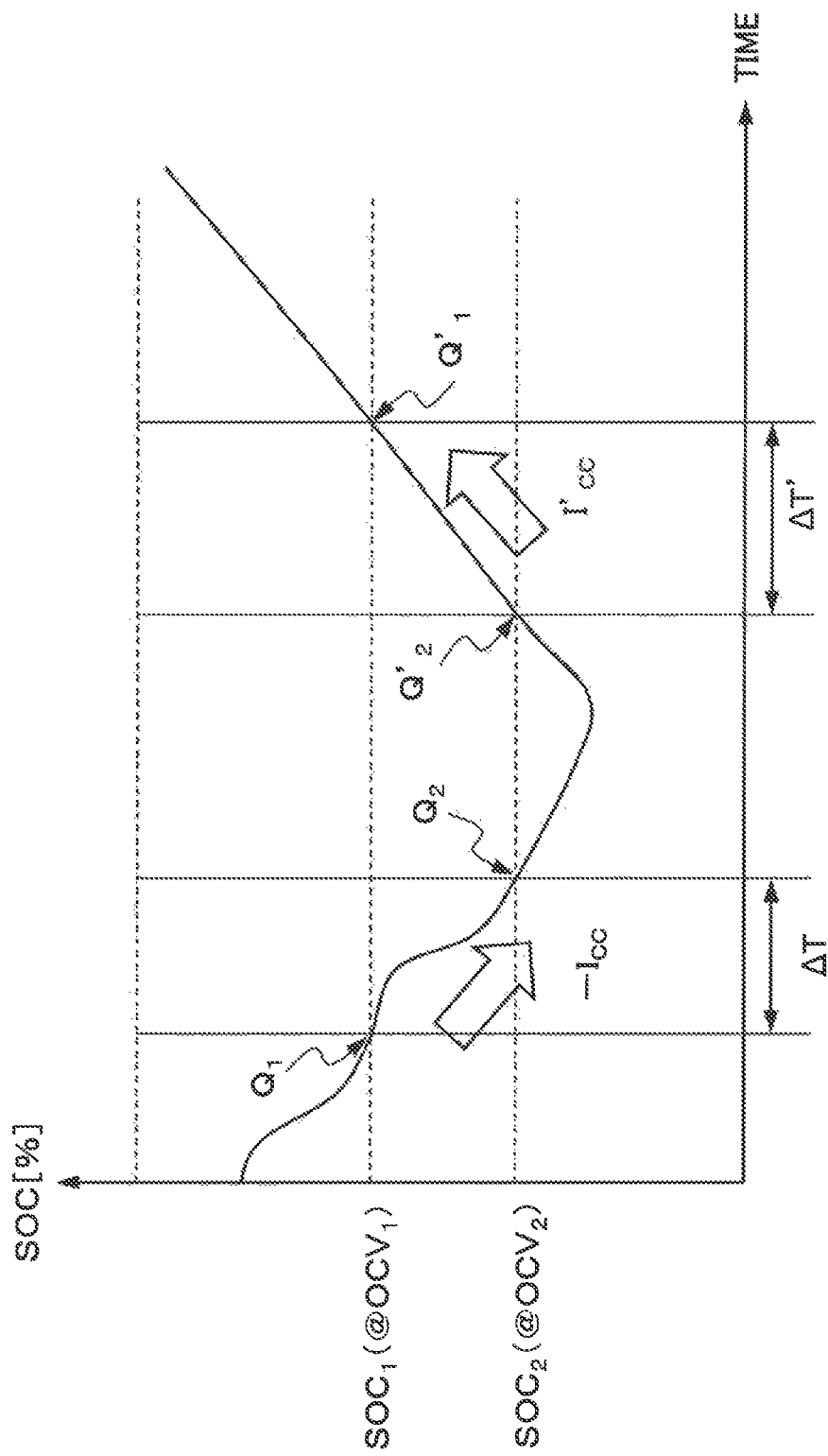
FIG. 8 is an explanatory diagram illustrating operations of a control device according to a third example embodiment.

FIG. 8 is an explanatory diagram for illustrating operations of the control device 10 according to the present example embodiment. FIG. 8 illustrates the remaining capacity SOC [%] that varies with time as calculated from the open circuit voltages OCVs in relation to discharge and charge operations when the control device 10 of the present example embodiment is detecting the full capacity.

First, the control unit 80 instructs the discharge mode to the charge-discharge control unit 70. During the discharge mode, the charge-discharge control unit 70 does not charge the storage battery 20, but discharges the storage battery 20.

During the discharging, the control unit 80 receives the OCV information ($OCV_c$) from the OCV estimating unit 50. When the $OCV_c$ reaches the first open circuit voltage $OCV_1$, the control unit 80 calculates the first remaining capacity $SOC_1$ [%] based on the stored OCV-SOC [%] relationship. In addition, the control unit 80 receives the integrated capacity information ($Q_e$) from the capacity calculating unit 60. The integrated capacity information ($Q_e$) received at this time point is the first integrated capacity $Q_1$.

In addition, the control unit 80 receives the time at which the first open circuit voltage $OCV_1$ is acquired from the OCV estimating unit 50, and stores the time as a first time.

Uninterruptedly, the control unit 80 continues the discharging. The control unit 80 receives the $OCV_c$ from the OCV estimating unit 50. When the $OCV_c$ reaches the second open circuit voltage $OCV_2$, the control unit 80 calculates the second remaining capacity $SOC_2$ [%] as with the first remaining capacity. In addition, the control unit 80 receives the second integrated capacity $Q_2$ from the capacity calculating unit 60. Then, the control unit 80 stores, as a second time, the time at which the second open circuit voltage $OCV_2$ is acquired from the OCV estimating unit 50.

Then, the control unit 80 calculates and stores a first time period $\Delta T$ [sec], which is a time difference between the second time and the first time.

Next, the control unit 80 instructs the charge-discharge control unit 70 to stop discharging the battery. Then, the control unit 80 instructs the charge mode to the charge-discharge control unit 70. The charge-discharge control unit 70 starts charging the battery.

During the charging, the control unit 80 receives the OCV information ($OCV_c$) from the OCV estimating unit 50. When the $OCV_c$ reaches the second open circuit voltage $OCV_2$, the control unit 80 calculates the second remaining capacity $SOC_2$ [%] based on the stored OCV-SOC [%] relationship. The control unit 80 further acquires the third integrated capacity ($Q'_2$) as of the time point from the capacity calculating unit 60.

Then, the control unit 80 stores, as a third time, the time at which the second open circuit voltage $OCV_2$ is acquired from the OCV estimating unit 50.

Uninterruptedly, the control unit 80 continues the charging. The control unit 80 receives the $OCV_c$ from the OCV estimating unit 50. When the $OCV_c$ reaches the first open circuit voltage $OCV_1$, the control unit 80 calculates the first remaining capacity $SOC_1$ [%] as with the second remaining capacity. Then, the control unit 80 receives the fourth integrated capacity $Q'_1$ from the capacity calculating unit 60. Further, the control unit 80 stores, as a fourth time, the time at which the first open circuit voltage $OCV_1$ is acquired from the OCV estimating unit 50.

Then, the control unit 80 calculates and stores a second time period $\Delta T'$ [sec], which is a time difference between the fourth time and the third time.

Then, the control unit 80 calculates the full capacity $Q_{full}$ based on the first remaining capacity $SOC_1$ [%], the second remaining capacity $SOC_2$ [%], the first integrated capacity $Q_1$, the second integrated capacity $Q_2$, the third integrated capacity $Q'_2$, the fourth integrated capacity $Q'_1$, the first time period $\Delta T$, and the second time period $\Delta T'$. The control unit 80 calculates the full capacity $Q_{full}$ by using Equation 7 below:

$$Q_{full} = \frac{(\Delta T'(Q_1 - Q_2) + \Delta T(Q'_1 - Q'_2))}{(\Delta T + \Delta T')} \bigg/ \frac{SOC_1 - SOC_2}{100} \quad \text{[Equation 7]}$$

The control device 10 of the third example embodiment assumes that i(t) [A] represent the currents measured during the discharging and i'(t) [A] represent the currents measured during the charging, by the current measuring unit 40, between the first open circuit voltage $OCV_1$ [V] and the second open circuit voltage $OCV_2$ [V].

The control device 10 of the third example embodiment further assumes that $i_{offset}$ [A] represents an offset included in a current value measured by the current measuring unit 40. Then, the individual current values are expressed by Equation 2 in this case.

Then, the amount of change in integrated capacity between the first open circuit voltage $OCV_1$ [V] and the second open circuit voltage $OCV_2$ [V] during the discharging is expressed by Equation 3.

On the other hand, the amount of change in integrated capacity during the charging according to the present example embodiment is expressed by Equation 8 below:

$$Q'_1 - Q'_2 [Ah] = \int_0^{\Delta T'} i'(t)dt/3600 \quad \text{[Equation 8]}$$

$$= \frac{\int_0^{\Delta T'} (i'_{real}(t) + i_{offset})dt}{3600}$$

$$= \frac{\int_0^{\Delta T'} i'_{real}(t)dt + i_{offset} \cdot \Delta T'}{3600}$$

As a result, a time weighted average of integrated capacity during the time periods of discharging and charging according to the present example embodiment is expressed by Equation 9 below. In this equation, $I_{cc}$ and $I'_{cc}$ represent the absolute values of average currents during the discharging and the charging, respectively.

$$\frac{\Delta T'(Q_1 - Q_2) + \Delta T(Q'_1 - Q'_2)}{\Delta T + \Delta T'} [Ah] = \frac{\Delta T \int_0^{\Delta T'} i'_{real}(t)dt - \Delta T' \int_0^{\Delta T} i_{real}(t)dt}{(\Delta T + \Delta T') \times 3600} \quad \text{[Equation 9]}$$

$$= \frac{\Delta T \int_0^{\Delta T'} I'_{CC}dt - \Delta T' \int_0^{\Delta T} (-I_{CC})dt}{(\Delta T + \Delta T') \times 3600}$$

$$= \frac{\Delta T \Delta Q_{12} + \Delta T' \Delta Q_{12}}{\Delta T + \Delta T'}$$

$$= \frac{(\Delta T + \Delta T')\Delta Q_{12}}{\Delta T + \Delta T'}$$

$$= \Delta Q_{12}$$

In Equation 9, both the integral [from 0 to $\Delta T'$] and the integral from [0 to $\Delta T$] result in $Q_{12}$ because they are the integrated capacities in the same range between SOCs (or OCVs).

Equation 9 takes a weighted average value of the amount of change in integrated capacity during the discharging and the amount of change in integrated capacity during the charging. Accordingly, the control device 10 can correctly calculate the amount of change in integrated capacity eliminating the influence of an offset by using Equation 9, even when the offset is included in the current value measured by the current measuring unit 40.

Furthermore, based on the calculated amount of change in integrated capacity, the control device 10 can calculate the full capacity by using Equation 10 below:

$$Q_{full}[\text{Ah}] = \Delta Q_{12} \bigg/ \frac{SOC_1 - SOC_2}{100} \qquad \text{[Equation 10]}$$
$$= \frac{\Delta T'(Q_1 - Q_2) + \Delta T(Q'_1 - Q'_2)}{(\Delta T + \Delta T')} \bigg/ \frac{SOC_1 - SOC_2}{100}$$

By using Equation 10, the control device 10 can correctly calculate the full capacity, even when an offset is included in a current value measured by the current measuring unit 40.

Effects of the third example embodiment are described below.

In addition to effects similar to those provided by the first and second example embodiments, the control device 10 according to the third example embodiment achieves an effect of eliminating the need for a charge-discharge control including, for example, charging and discharging at a constant current, during the discharging and the charging between the first open circuit voltage $OCV_1$ and the second open circuit voltage $OCV_2$.

The reasons are as follows.

This is because the control unit 80 calculates time periods for discharging and charging based on times used for integrated capacities, and uses the calculated time periods to calculate a full capacity.

Fourth Example Embodiment

A fourth example embodiment of the present invention will be described.

The configuration of a control device 10 according to the present example embodiment is similar to that of the control device 10 of the first to third example embodiments, and thus its detail descriptions are omitted. Variables appearing in the following descriptions are also similar to those of the first example embodiment. The control device 10 of the present example embodiment may be implemented with the computer illustrated in FIG. 6.

The control unit 80 in the control device 10 according to the present example embodiment calculates a current offset when calculating a full capacity. The control unit 80 sends the calculated current offset to the capacity calculating unit 60.

The capacity calculating unit 60 stores the current offset received from the control unit 80. Then, the capacity calculating unit 60 makes a value by subtracting the current offset from the charge-discharge current for the storage battery 20 received from the current measuring unit 40 a new current. Then, the capacity calculating unit 60 calculates the capacity as the integral value of current. Then, the capacity calculating unit 60 calculates the integrated capacity by integrating the calculated capacity.

Alternatively, the capacity calculating unit 60 may send the current offset received from the control unit 80 to the current measuring unit 40. In this case, the current measuring unit 40 stores the current offset received from the capacity calculating unit 60. When measuring a charge-discharge current for the storage battery 20, the current measuring unit 40 makes a value by subtracting the current offset from the measured current value a new current value. Then, the current measuring unit 40 sends the new current value to the capacity calculating unit 60 or to the control unit 80.

Alternatively, the control unit 80 may send the calculated current offset directly to the current measuring unit 40.

When the control device 10 of the present example embodiment operates in a similar manner to the control device 10 of the third example embodiment, a current offset ($i_{offset}$) is expressed as below. That is, the current offset ($i_{offset}$) is expressed by Equation 11 by using the first integrated capacity $Q_1$, the second integrated capacity $Q_2$, the third integrated capacity $Q'_2$, the fourth integrated capacity $Q'_1$, the first time period $\Delta T$, and the second time period $\Delta T'$:

$$i_{offset}[\text{A}] = ((Q'_1 - Q'_2) - (Q_1 - Q_2)) \bigg/ \frac{\Delta T + \Delta T'}{3600} \qquad \text{[Equation 11]}$$

When the control device 10 of the present example embodiment operates in a similar manner to the control device 10 of the first or second example embodiment, the control device 10 calculates a charge time ($\Delta T$) or a discharge time ($\Delta T$) between the first open circuit voltage $OCV_1$ and the second open circuit voltage $OCV_2$, as with the third example embodiment. Then, the control device 10 can calculate the current offset ($i_{offset}$) by applying the first integrated capacity $Q_1$, the second integrated capacity $Q_2$, the third integrated capacity $Q'_2$, the fourth integrated capacity $Q'_1$, and the charge or discharge time $\Delta T$ to Equation 12 below:

$$i_{offset}[\text{A}] = ((Q'_1 - Q'_2) - (Q_1 - Q_2)) \bigg/ \frac{2\Delta T}{3600} \qquad \text{[Equation 12]}$$

Based on the aforementioned operations, the control device 10 of the present example embodiment can detect the charge-discharge current more accurately. In addition, the control device 10 of the present example embodiment can calculate a more accurate integrated capacity, because the integrated capacity is calculated by integrating the capacity which is calculated as an integral value of a correct current.

After detecting the full capacity, the control unit 80 acquires the open circuit voltage $OCV_r$ from the OCV estimating unit 50, and calculates the remaining capacity $SOC_r$ [%] based on the relationship between the OCV and the SOC [%] stored in the control unit 80. In addition, the control unit 80 calculates the reset integrated capacity $Q_r$ by using Equation 13 below:

$$Q_r = Q_{full} \times \frac{SOC_r}{100} \qquad \text{[Equation 13]}$$

Next, the control unit 80 sends the calculated reset integrated capacity to the capacity calculating unit 60. The capacity calculating unit 60 resets the integrated capacity by using the received reset integrated capacity. Then, the capacity calculating unit 60 calculates the integrated capacity after reset, i.e., the integrated capacity calculated by using the current without a current offset.

Effects of the fourth example embodiment are described below.

In addition to the effects provided by the first to third example embodiments, the control device 10 of the present example embodiment can achieve an effect of calculating a more accurate integrated capacity.

This is because the control unit 80 calculates the reset integrated capacity, and the capacity calculating unit 60 calculates the integrated capacity after reset, i.e., the integrated capacity calculated by using the current without a current offset.

Furthermore, the control device 10 of the present example embodiment can calculate a remaining capacity based on the ratio between the full capacity and the aforementioned integrated capacity.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2014-185979, filed on Sep. 12, 2014, the disclosure of which is incorporated herein in its entirety by reference.

REFERENCE SINGS LIST

10 Control device
11 Control device
20 Storage battery
21 Secondary battery
30 Voltage measuring unit
40 Current measuring unit
50 OCV estimating unit
60 Capacity calculating unit
70 Charge-discharge control unit
80 Control unit
90A Negative electrode terminal
90B Positive electrode terminal
600 Control device
610 CPU
620 ROM
630 RAM
640 Internal storage device
650 IOC
660 Input apparatus
670 Display apparatus
680 NIC
700 Storage medium

The invention claimed is:

1. A control device comprising:
an open circuit voltage (OCV) estimating unit that estimates, based on a voltage value and a current value of a controlled device, an OCV of the controlled device;
a capacity calculating unit that calculates an integrated capacity of the controlled device based on the current value of the controlled device; and
a control unit that controls discharging and charging of the controlled device, and calculates a full capacity of the controlled device based on:
a first remaining capacity (SOC) and a second SOC that are remaining capacities at a predetermined first OCV and a predetermined second OCV during the discharging or the charging of the controlled device;
a first integrated capacity and a second integrated capacity that are integrated capacities at the first OCV and the second OCV during the discharging;
a third integrated capacity and a fourth integrated capacity that are integrated capacities at the second OCV and the first OCV during the charging; and
an average value of:
a first amount of change in integrated capacity, the first amount of change in integrated capacity being a difference between the first integrated capacity and the second integrated capacity, and
a second amount of change in integrated capacity, the second amount of change in integrated capacity being a difference between the third integrated capacity and the fourth integrated capacity.

2. The control device according to claim 1, wherein the control unit controls a storage battery as the controlled device.

3. The control device according to claim 1, wherein the control unit controls a constant-current charge and a constant-current discharge between the first OCV and the second OCV, as a control on the controlled device.

4. The control device according to claim 1, wherein the control unit controls so that a charge is performed between the first OCV and the second OCV at an average of the current between the first OCV and the second OCV during discharging, as a control on the controlled device.

5. The control device according to claim 1, wherein the control unit calculates time periods between the first OCV and the second OCV during discharging and during charging, and
calculates the full capacity by using the calculated time periods.

6. The control device according to claim 1, wherein the control unit calculates a time period between the first OCV and the second OCV during discharging or during charging, and
calculates, based on the time period and the first to fourth integrated capacities, a correction value for the integrated capacity of the controlled device, and
the capacity calculating unit corrects the integrated capacity based on the correction value.

7. A control apparatus comprising:
the control device according to claim 1;
the controlled device;
a voltage measuring unit that measures a voltage value of the controlled device;
a current measuring unit that measures a current value of the controlled device; and
a charge-discharge control unit that controls charge and discharge operations of the controlled device based on an instruction from the control unit.

8. A control method comprising:
estimating, based on a voltage value and a current value of a controlled device, an open circuit voltage (OCV) of the controlled device;
calculating an integrated capacity of the controlled device based on the current value of the controlled device; and
controlling discharging and charging of the controlled device, and calculating a full capacity of the controlled device based on:
a first remaining capacity (SOC) and a second SOC that are remaining capacities at a predetermined first OCV and a predetermined second OCV during the discharging or the charging of the controlled device;

a first integrated capacity and a second integrated capacity that are integrated capacities at the first OCV and the second OCV during the discharging;

a third integrated capacity and a fourth integrated capacity that are integrated capacities at the second OCV and the first OCV during the charging; and an average value of:
- a first amount of change in integrated capacity, the first amount of change in integrated capacity being a difference between the first integrated capacity and the second integrated capacity, and
- a second amount of change in integrated capacity, the second amount of change in integrated capacity being a difference between the third integrated capacity and the fourth integrated capacity.

9. A computer readable non-transitory recording medium embodying a program, the program causing a computer to perform a method, the method comprising:

estimating, based on a voltage value and a current value of a controlled device, an open circuit voltage (OCV) of the controlled device;

calculating an integrated capacity of the controlled device based on the current value of the controlled device; and controlling discharging and charging of the controlled device, and calculating a full capacity of the controlled device based on:

a remaining capacity (SOCK and a second SOC, which are remaining capacities at a predetermined first OCV and a predetermined second OCV during the discharging or the charging of the controlled device;

a first integrated capacity and a second integrated capacity, which are integrated capacities at the first OCV and the second OCV during the discharging;

a third integrated capacity and a fourth integrated capacity, which are integrated capacities at the second OCV and the first OCV during the charging; and an average value of:
- a first amount of change in integrated capacity, the first amount of change in integrated capacity being a difference between the first integrated capacity and the second integrated capacity, and
- a second amount of change in integrated capacity, the second amount of change in integrated capacity being a difference between the third integrated capacity and the fourth integrated capacity.

* * * * *